United States Patent [19]

Nugent et al.

[11] Patent Number: 4,707,665
[45] Date of Patent: Nov. 17, 1987

[54] LOW NOISE SIGNAL GENERATOR

[75] Inventors: John L. Nugent, Essex; George C. Rush, Sykesville; Norman G. Matthews, Cockeysville, all of Md.

[73] Assignee: Westinghouse Electric Corp., Pittsburgh, Pa.

[21] Appl. No.: 575,429

[22] Filed: Jan. 31, 1984

[51] Int. Cl.$^4$ ................ H03B 19/00; H04B 11/32
[52] U.S. Cl. ................................ 328/14; 328/16; 307/261; 307/271; 455/63; 455/165
[58] Field of Search ............... 328/14, 16, 15, 18; 65/307; 375/260, 227, 261, 270, 271; 455/50, 63, 65, 112, 130, 165, 190; 331/51, 2, 73, 22, 77, 38

[56] References Cited

U.S. PATENT DOCUMENTS

| | | | |
|---|---|---|---|
| 3,372,346 | 3/1968 | Rodgers et al. | 331/2 |
| 3,626,315 | 12/1971 | Stirling et al. | 331/77 |
| 3,696,306 | 10/1972 | Kline, Jr. | 331/2 |
| 3,854,102 | 12/1974 | Seipel et al. | 331/77 |
| 4,121,163 | 10/1978 | Fikart | 331/77 |

OTHER PUBLICATIONS

Bonnier, "Sythetiseurs Faible Bruit pour Radars", Paris, Fr., Dec. 4–8th, 1978, Colloque International Sur Le Radar.

Primary Examiner—Stanley D. Miller
Assistant Examiner—Timothy P. Callahan
Attorney, Agent, or Firm—W. G. Sutcliff

[57] ABSTRACT

A signal generator for high level low noise signals in which the preferred embodiment of the invention utilizes the output signal of a low noise crystal oscillator as a fundamental reference signal. The fundamental reference signal is multiplied to generate a series of coherent reference signals. Additionally, one of the coherent reference signals is coupled as an input signal to a divide circuit to generate at the output of the divide circuit a plurality of coherent low frequency reference signals. The coherent reference signals and the low frequency coherent reference signals are utilized by a synthesizer to generate a plurality of coherent signals having a frequency determined by the synthesizer. The output signal of the synthesizer is combined with one or more of the reference signals to generate the microwave output signal which is stepped from a minimum to a maximum value in equal increments.

7 Claims, 6 Drawing Figures

LOW NOISE SIGNAL GENERATOR

STATEMENT OF GOVERNMENT RIGHTS

This invention was either conceived or first reduced to practice under Contract No. DAAK10-81-C-0093 with the U.S. Government.

BACKGROUND OF THE INVENTION

1. Field of the Invention:

The invention relates to signal generators and more specifically to signal generators providing VHF, UHF and microwave signals which are coherent with the reference, with the microwave signals being stepped in predetermined increments.

2. Description of the Prior Art:

Prior art signal generators provided microwave signals which can be stepped in increments have had relatively low stepping speeds and relatively high noise levels. This performance has been related to the inherent noise levels of the individual components of the system, in particular typical voltage-controlled reference oscillators as well as to the overall organization.

SUMMARY OF THE INVENTION

The invention provides a signal generator for generating microwave signals (X band) which are stepped in equal increments. Additionally, the system provide both UHF and VHF reference signals which are coherent to the microwave signals. Fundamentally, the system utilizes a UHF low noise oscillator to provide a low noise reference signal. The low noise UHF reference signal is frequency multiplied to generate both UHF and X band signals which are coherent with the oscillator. A divider is utilized to generate VHF signals which are sub-multiples of the original reference oscillator. Combining circuits are utilized to combine the output signals and the sub-multiples of the reference signal to produce the output signal which can be stepped in increments of 5 megahertz. This technique permits the use of low noise fixed frequency reference oscillators. Overall system broadband noise characteristics are determined by the noise characteristics of the reference oscillator.

DESCRIPTION OF THE PREFERRED EMBODIMENTS

Figure 1:
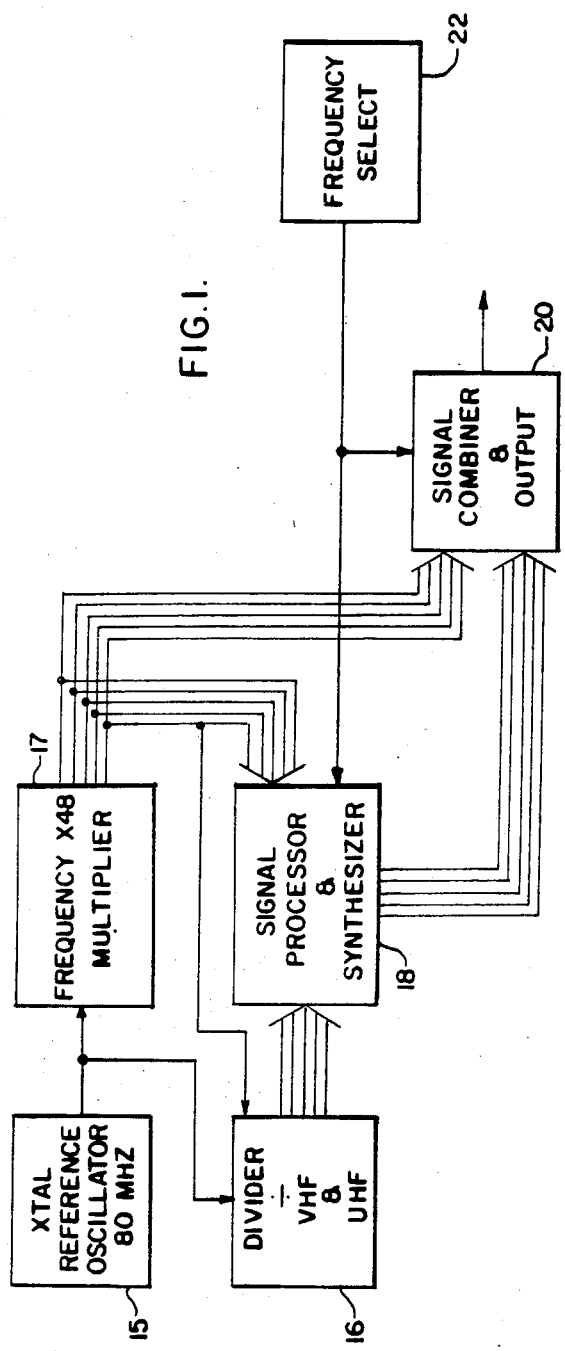
FIG. 1 is an overall functional block diagram of the invention.

FIG. 1 is a functional block diagram of the preferred embodiment of the invention. A highly stable low noise fixed frequency crystal-controlled reference oscillator 15 provides a stable reference signal at a frequency of 80 megahertz. The basic 80 megahertz signal is multiplied by two within oscillator 15 and then is multiplied by by forty-eight in four stages by a multiplier 17 to generate reference signals at 320, 640, 1,280 and 7,680 megahertz. The 160 megahertz signal is coupled to a frequency divider 16. Selected ones of the reference signals are coupled to either the signal processor and synthesizer 18 or to the signal combiner 20. Frequency select circuitry 22 which may, for example, be a microprocessor providing frequency select signals to the signal processor and synthesizer 18 and to the signal combiner 20. Signal combiner 20 provides an X band output signal which is stepped in discrete frequency increments, for example, 5 megahertz steps.

Since all of the signals generated by the system are referenced to the crystal oscillator having a frequency of 80 megahertz, all of the various signals are coherent with respect to the reference signal and to each other. Additionally, it is quite feasible to design all the components of the system to achieve a very low noise level, for example, the flat noise can be less than −125 dbc per hertz.

Figure 2:
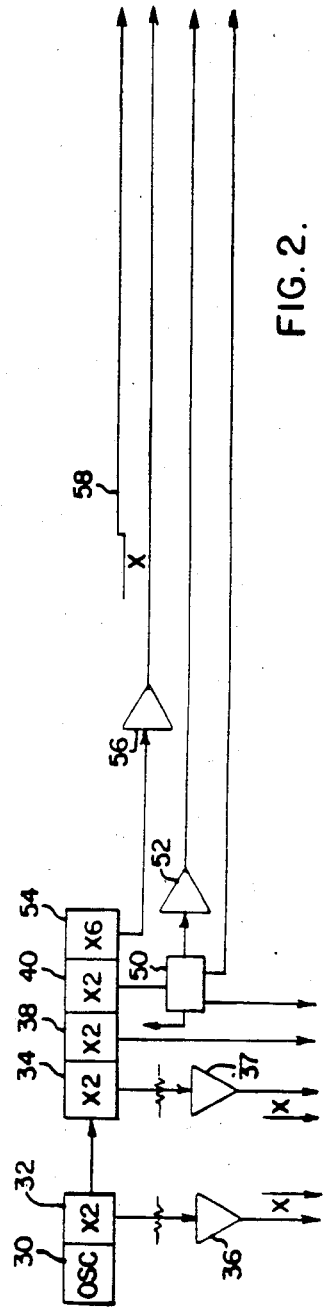
FIG. 2 is a functional block diagram of the reference oscillator and the associated frequency multipliers.

FIG. 2 is a more detailed drawing of the reference oscillator and the associated multiplier. As previously discussed, the basic reference frequency at 80 megahertz is provided by a low noise crystal oscillator stage 30. The basic 80 megahertz reference signal is multiplied by two by a first multiplier stage 32 to generate a stable frequency of 160 megahertz. Two output signals are provided by the first multiplier stage 32 with the first coupled to the input of the second multiplier 34 and the second coupled to the input of a buffer amplifier 36. Buffer amplifier 36 provides a buffered output signal at a frequency of 160 megahertz.

The second multiplier 34 multiplies the 160 megahertz output signal of the first multiplier 32 to generate a reference signal of 320 megahertz. This 320 megahertz signal is amplified by a buffer 37 and coupled to the third stage 38 of the multiplier chain. A stable reference signal of 640 megahertz is generated by the third multiplier stage 38 by multiplying the 320 megahertz reference signal by two. This 320 megahertz reference signal is coupled to the third stage 40 of the multiplier chain where it is multiplied to generate another reference signal having a frequency of 1,280 megahertz. A power divider and coupler 50 divides the 1,280 megahertz signal into four parts with one of these signals being further amplified by a conventional buffer amplifier 52. An additional reference signal having a frequency of 7,680 megahertz is generated by mulitplier 54 by multiplying the 1,280 megahertz reference signal by 6. This 1,280 megahertz reference signal is amplified by a buffer 56 and divided into two signals by a power divider 58. Thus, it can be seen that the reference oscillator and multiplier generates reference signals having frequencies of 160, 320, 640, 1,280 and 7,680 megahertz. These signals are utilized by various portions of the system to generate the final output frequencies as subsequently described.

Figure 3:
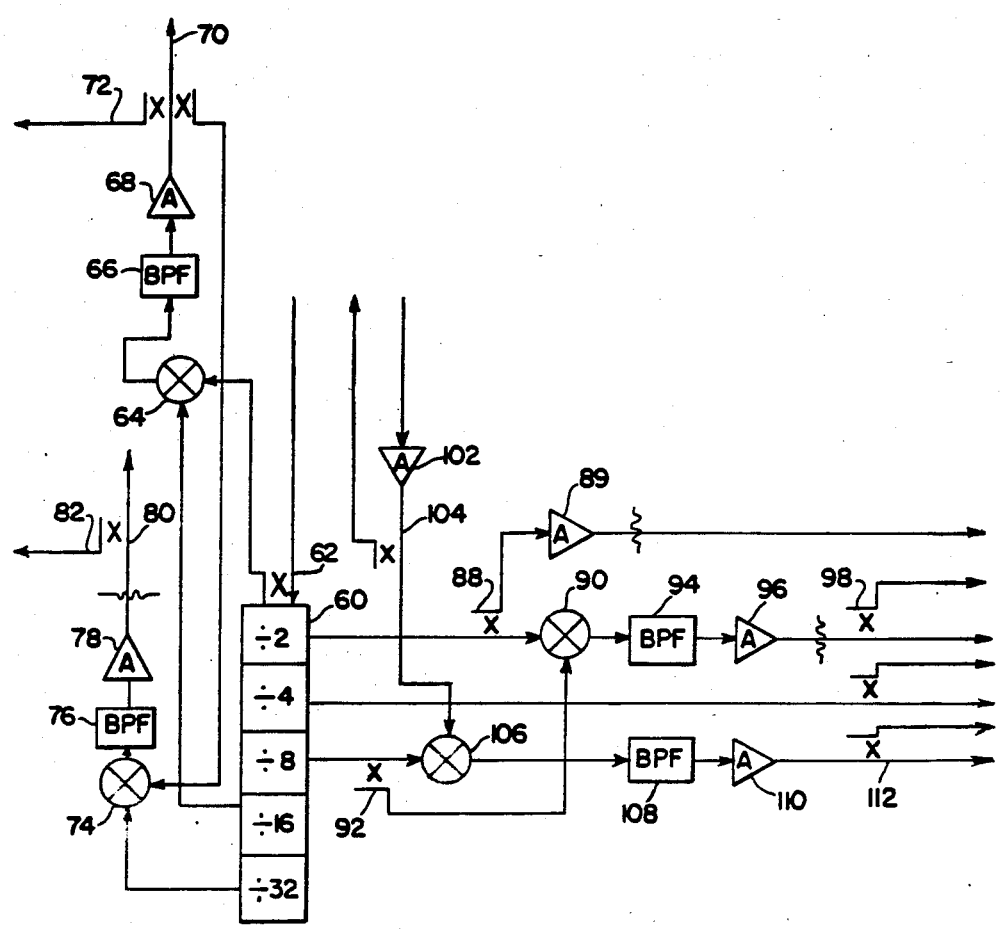
FIG. 3 is a functional block diagram of the frequency divider.

The frequency divider circuit illustrated in FIG. 3 receives the 160 and 320 megahertz signals from the reference oscillator and multiplier and generates additional signals utilized by the system as subsequently described. More specifically, this circuitry generates stable reference signals at 40, 80, 100, 150, 155, 160, 300 and 320 megahertz. All of these signals are coherent with the original oscillator frequency.

The 160 megahertz signal from the output of the second multiplier stage 32 is coupled to the input of a five stage frequency divider circuit 60. This divider circuit 60 is free-running with the stages of the divider circuit 60 generating in descending order signals having a frequency of 80, 40, 20, 10 and 5 megahertz. The 160 megahertz signal is also divided in a power divider circuit 62 to provide one input to a balanced mixer circuit 64. The second input to the balanced mixer 64 is the ten megahertz output signal of the fourth stage of the divider 60. This generates at the output of the balanced mixer 64 two signals having a frequency of 150 and 170 megahertz. A bandpass filter 66 couples the 150 megahertz signal to the input terminal of a buffer amplifier 68 and attenuates the 170 megahertz signal. A buffer amplifier 68 further amplifies the 150 megahertz signal and couples this signal to output terminals, 70 and 72, and to one input of a mixer 74. The second input to mixer 74 is the five megahertz output signal from the fifth stage of divider 60 to generate at the output of this mixer two signals having frequencies of 145 and 155 megahertz. A bandpass filter 76 removes the 145 megahertz signal and couples the 155 signal to the input of a buffer amplifier 78. Buffer amplifier 78 further amplifies the 155 megahertz signal and couples it to terminals 80 and 82.

An 80 megahertz reference signal is provided by the first stage of the divider 60 as previously explained. This signal is coupled to a power divider 88 to generate two signals, the first of which is coupled to the input of a balanced mixer 90. A 20 megahertz reference signal is provided to the second input of the balanced mixer 90 through a power divider 92 from the third stage of the divider 60. This produces at the output of the mixer 90 two signals having frequencies of 60 and 100 megahertz. The 60 megahertz signal is removed by a bandpass filter 94 to produce a low noise reference signal of 100 megahertz which is further amplified by a buffer amplifier 96. This signal is split into two parts by a power divider 98 to produce two signals at 100 megahertz.

A buffer amplifier 102 amplifiers the 320 megahertz reference signal from the multiplier chain and couples it to a power divider 104 to produce two signals. One of these signals is coupled to one input of a mixer 106. A 20 megahertz reference signal is provided to the second input of the mixer 106 by the third stage of the divider 60. This produces at the output of mixer 106 signals having frequencies of 300 and 340 megahertz. A bandpass filter 108 blocks the 340 megahertz signal and couples the 300 megahertz signal to the input of a buffer amplifier 110 to produce an amplified reference signal of 300 megahertz which is coupled to the input of a power divider 112 to produce two stable reference signals having a frequency of 300 megahertz. The second output of power divider 88 is also coupled to the input of a buffer amplifier 89 to produce at the output of this amplifier a signal having a frequency of 80 megahertz. All of these signals are utilized in the remainder of the circuitry as subsequently described in more detail.

Figure 4:
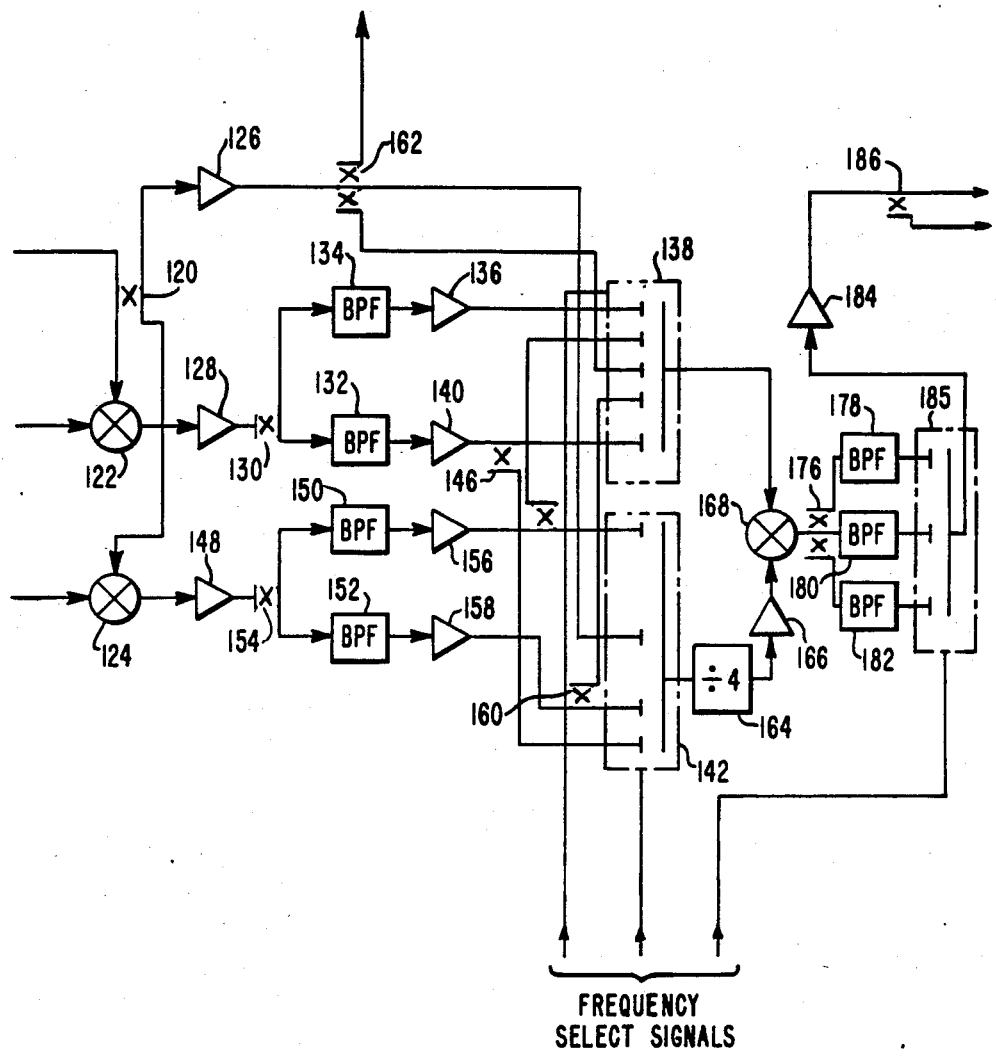
FIG. 4 is a functional block diagram of the frequency synthesizer.

FIG. 4 is a functional block diagram of the frequency synthesizer utilized to generate twenty signals having frequencies spaced 10 megahertz apart and ranging from 390 to 580 megahertz, inclusive. More specifically, the 640 megahertz reference signal from the third multiplier stage 38 (FIG. 2) is coupled to a power divider 120 to produce signals which are coupled to the first input of mixers 122 and 124 and a buffer amplifier 126. The second input to the first mixer 122 is an 80 megahertz reference signal provided by buffer amplifier 89 of FIG. 3. Reference signals having frequencies of 560 and 720 megahertz are produced at the output of the first mixer 122 and amplified by a buffer amplifier 128. These reference signals are coupled by a power divider 130 to the inputs of a 560 megahertz bandpass filter 132 and a 720 megahertz bandpass filter 134. A first buffer amplifier 136 amplifies the 720 megahertz reference signal and couples it to one input terminal of a switching circuit 138. (In the experimental model, pin diode solid-state switches manufactured by DAICO Industries were used.) Similarly, a second buffer amplifier 140 amplifies the 560 megahertz reference signal and couples it to another input of the switching circuit 138 and to an input terminal of a second switching circuit 142 through a power divider 146.

The second input to the second mixer circuit 124 is the 40 megahertz reference signal from the second stage of the divider 60 (FIG. 2) to produce at the output of this mixer reference signals having frequencies of 600 and 680 megahertz. These reference signals are further amplified by a buffer amplifier 148 and coupled to first and second bandpass filters having center frequencies of 600 and 680 megahertz through a power divider 154. These signals are further amplified by buffer amplifiers 156 and 158. The 680 megahertz reference signal is coupled to one input terminal of switching circuit 142. The 600 megahertz reference signal is coupled to a power divider 160 and to an input terminal of switching circuits 138 and 142.

The 640 megahertz output signal from buffer amplifier 126 is also coupled to a power divider 162 to produce 640 megahertz reference signals which are coupled to input terminals of switching circuits 138 and 142. In this configuration, it can be seen that all five input terminals of switching circuit 138 are coupled to different frequencies and provide at the output of this circuit a signal having a frequency of either 560, 600, 640, 680 or 720 megahertz depending upon the state of switching circuit 138.

The output signal of the second switching circuit 142 is coupled to the input of a divide-by-four circuit 164. The output signal of the divide-by-four circuit 164 is amplified by a buffer amplifier 166 to provide one input to a mixer 168. The input to the mixer 168 can have a frequency of 140, 150, 160 or 170 megahertz. The second input to the mixer 168 is provided by the output signal of the first switching circuit 138. This produces at the output of the mixer 168 a signal which can be stepped in 10 megahertz increments beginning with 390 megahertz and extending through 580 megahertz as determined by the status of the frequency select signals.

The output of mixer 168 is coupled to the input of a three-way power divider 176 whose outputs are coupled to the inputs of three bandpass filters 178, 180 and 182. These filters have center frequencies at 425, 485 and 545 megahertz, respectively. A three-position switching relay 185 has its inputs coupled to the output terminals of the bandpass filters 178, 180, 182 and its output to the input of a buffer amplifier 184. The output of buffer amplifier 184 is coupled to the input of a power divider 186 to provide two output signals. Signals to control the switching circuits 138, 142 and 185 to produce the stepped output signal as described above are provided by the frequency select circuit 22 as illustrated in FIG. 1 and may be a microprocessor, for example.

Figure 5:
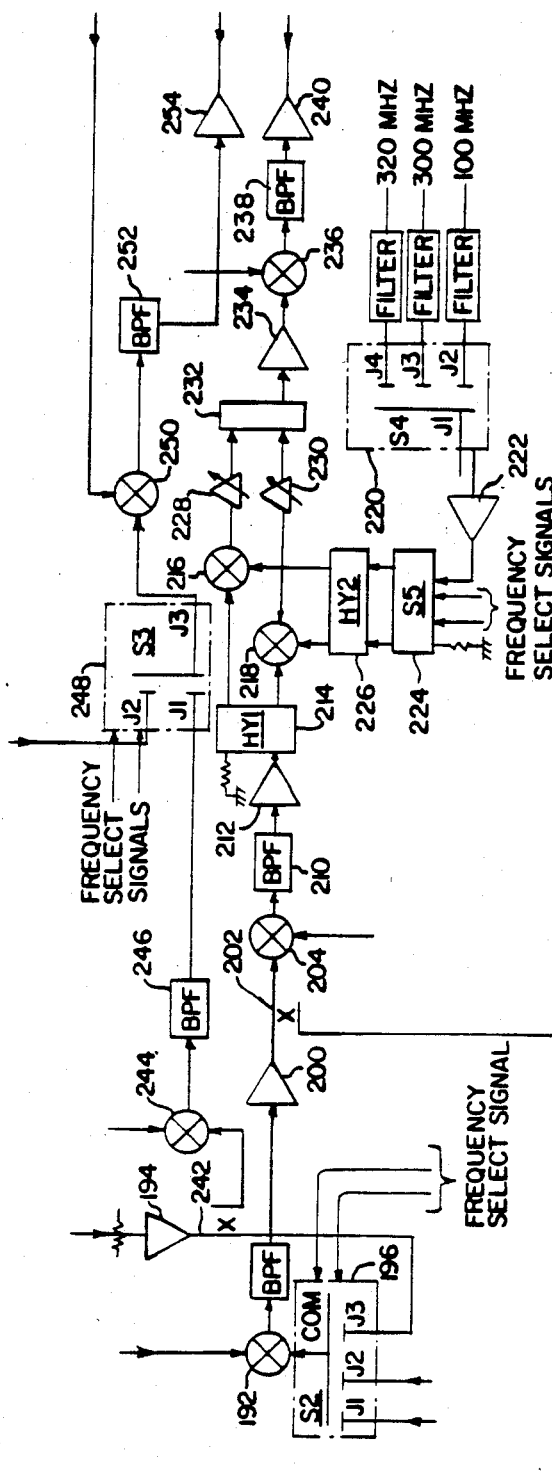
FIG. 5 is a block diagram of the RF combiner.

FIG. 5 is a diagram of the RF combiner circuit. A mixer 192 has its first input coupled to the 1,280 megahertz reference signal from power divider 50 of FIG. 2. Similarly, the 150 megahertz reference signal from the frequency divider (FIG. 3) is coupled to the input of a buffer amplifier 194. The output of the buffer amplifier 194 is coupled to the input of a switching circuit 196. Similarly, the 155 megahertz reference signal from the frequency divider is coupled to the second input terminal of switching circuit 196. Thus, the second input to the mixer 192 is either 150 or 155 megahertz depending on the position of switching circuit 196. A signal having a frequency of either 1,430 or 1,435 megahertz is provided at the output of mixer 192. This signal is filtered by a bandpass filter 198 and amplified by a buffer amplifier 200. A power divider 202 divides the output signal of the buffer amplifier 200 into two parts, one of which is used as an external reference signal and the second is coupled to the input of another mixer 204. The second input to mixer 204 is the 390 to 580 megahertz signal which is stepped in 20 steps of 10 megahertz each from the synthesizer illustrated in FIG. 4. As a result, a signal stepped in 5 megahertz steps ranging from 1,820 to 2,015 megahertz is produced at the output of mixture 204.

A bandpass filter 210 couples the signal ranging in frequency from 1,820 to 2,015 megahertz from mixer 204 to a buffer amplifier 212. A hybrid coupler 214 divides the output signal of buffer amplifier 212 into two signals which serve as first inputs to two additional balanced mixers 216 and 218. A switching circuit 220 has its inputs coupled to the 100, 300 and 320 megahertz signal. The output of this switching circuit 220 is coupled to the input of a buffer amplifier 222. Output signals of buffer amplifier 222 are coupled to a phase selection circuit 224 and a second 90° hybrid circuit 226 to provide the second input signals to the balanced mixers 216 and 218. The output signals of the mixers 216 and 218 are coupled through phase adjustors 228 and 230 to the inputs of a combiner 232 to produce at the output of the combiner 232 signals ranging from 1,500 to 2,335 megahertz in 5 megahertz steps using conventional single side band techniques. These signals are further amplified by buffer amplifier 234 and coupled to the inputs of another mixer 236.

The second input to mixer 236 is the 7,680 megahertz signal from the fifth stage of the multiplier. This produces at the output of mixer 236 a signal ranging in frequency from 9.180 to 10.015 gigahertz stepped in 5 megahertz steps. This signal is filtered by a bandpass filter 238 and further amplified by a buffer amplifier 240 to produce the desired signal level.

A lower band signal is produced by coupling a portion of the 150 megahertz output signal of buffer amplifier 194 through a power divider 242 to one input of another balanced mixer 244. The second input signal to another balanced mixer 244. The second input signal to the balanced mixer 244 is the 1,280 megahertz signal from the fourth stage of the multiplier. The output signal of the mixer 244 is coupled through a bandpass filter 246 to one input of a switching circuit 248. The output signal of the switching circuit 248 is coupled to the first input of a mixer 250. The second input to the mixer 250 is the high band output signal previously discussed. This produces at the output of the bandpass filter 252 a low band signal ranging from 7.75 to 8.585 gigahertz in 5 megahertz steps. This signal is further amplified by a buffer amplifier 254 to produce the low band output signal.

Alternatively, a second input is provided to the switching circuit 248 permitting the high band signal to be mixed with an external synthesizer to produce a low band signal which can be changed without changing the frequency of the high band signal.

Figure 6:
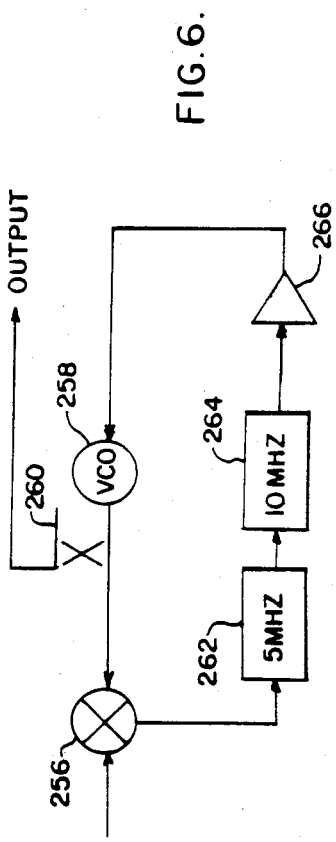
FIG. 6 is a block diagram of a phase-locked voltage-controlled oscillator for filtering the output signal.

The high band and low band signals previously discussed have extremely low noise levels typically ranging in the neighborhood of −127 dbc/1 Hz in the flat band. However, it has been found that these output signals can contain harmonics which are spaced 5 megahertz to either side of the carrier. This is believed to be due to leakage in the various switching circuits and may be significantly decreased with further improvement in these components. However, these harmonics can be removed using the apparatus illustrated in FIG. 6. For example, to remove the harmonics from the high band carrier, this signal is coupled to the input of a phase detector 256. A voltage-controlled microwave oscillator 258 has its output coupled to a power divider 260 to provide the output signal and a second input to the mixer 256. The output of the phase detector 256 is coupled through the series combination of five and ten megahertz notch filters 262 and 264 to the input of an amplifier 266. The output of amplifier 266 controls the frequency of the voltage-controlled oscillator 258 to maintain the output signal of this oscillator phase locked with the transmit signal. This effectively provides additional low pass filtering of the output signal of the system. An identical technique is used to filter the low band signal with the exception that the voltage-controlled oscillator operates over a different frequency band.

The system comprising the invention can be assembled using commercially available components. However, it should be emphasized that the overall noise figure is primarily determined by the noise generated by the reference oscillator 15 (FIG. 1). Additional noise is contributed by the remainder of the system. Additionally, the preferred embodiment of the invention, illustrated in FIG. 1, may be implemented using systems differing in detail from those illustrated in the remainder of the drawings. These different implementations are believed to be within the scope of this invention.

We claim:
1. A signal generator which generates output signals stepped in discrete frequency increments comprising:
 (a) a stable oscillator for generating a fundamental reference signal;
 (b) a multiplier to which said fundamental reference signal is applied for generating a plurality of coherent reference signals, each having a frequency which is a multiple of the frequency of said fundamental reference signal and coherent thereto;
 (c) a divider to which is input at least one of said plurality of coherent reference signals, and the fundamental reference signal also input to the divider for generating a plurality of coherent low frequency signals in the UHF and VHF range;
 (d) a synthesizer for selectively combining said plurality of coherent reference signals and said plurality of low frequency reference signals to produce a plurality of incrementally spaced apart signals; and
 (e) a combining circuit for combining said plurality of incrementally spaced apart signals from said synthesizer and plurality of coherent reference signals to produce the signal generator output signal which is stepped in discrete frequency increments.

2. A signal generator in accordance with claim 1 wherein said synthesizer selectively combines said plurality of coherent reference signals with said plurality of coherent low frequency reference signals with the selected combination being determined by an externally supplied digital signal.

3. A signal generator in accordance with claim 2 wherein said plurality of coherent reference signals have respective frequencies of 320, 640, 1,280 and 7,680 megahertz.

4. A signal generator in accordance with claim 3 wherein said plurality of coherent low frequency reference signals have respective frequencies of 80, 40, 20, 10 and 5 megahertz.

5. A signal generator in accordance with claim 4 further including a filter circuit serially connected to the combining circuit for filtering unwanted harmonics from the combining circuit output signals.

6. A signal generator in accordance with claim 5 wherein said filter circuit comprises a voltage-controlled oscillator phase locked to said output signal.

7. A signal generator in accordance with claim 1 wherein frequency select means is connected to the synthesizer and provides a frequency select control signal thereto, which frequency select means is also connected to the combining circuit and provides a frequency select control signal thereto whereby said combining circuit output signal can be stepped in 5 megahertz increments.

* * * * *